US011011439B2

(12) United States Patent
Kimura

(10) Patent No.: US 11,011,439 B2
(45) Date of Patent: May 18, 2021

(54) PRE-MOLDED SUBSTRATE, METHOD OF MANUFACTURING PRE-MOLDED SUBSTRATE, AND HOLLOW TYPE SEMICONDUCTOR DEVICE

(71) Applicant: ABLIC Inc., Chiba (JP)

(72) Inventor: Noriyuki Kimura, Chiba (JP)

(73) Assignee: ABLIC INC., Chiba (JP)

( * ) Notice: Subject to any disclaimer, the term of this patent is extended or adjusted under 35 U.S.C. 154(b) by 196 days.

(21) Appl. No.: 16/415,838

(22) Filed: May 17, 2019

(65) Prior Publication Data
US 2019/0355635 A1 Nov. 21, 2019

(30) Foreign Application Priority Data
May 17, 2018 (JP) .............................. JP2018-095178

(51) Int. Cl.
*H01L 23/00* (2006.01)
*H01L 23/053* (2006.01)

(52) U.S. Cl.
CPC ............ *H01L 23/053* (2013.01); *H01L 24/05* (2013.01); *H01L 24/85* (2013.01); *H01L 2224/056* (2013.01); *H01L 2224/854* (2013.01)

(58) Field of Classification Search
CPC ..... H01L 23/053; H01L 23/48; H01L 23/495; H01L 24/05; H01L 24/27; H01L 24/32; H01L 24/83; H01L 24/85; H01L 24/97
See application file for complete search history.

(56) References Cited

U.S. PATENT DOCUMENTS

| 6,097,101 | A | 8/2000 | Sato et al. | |
|---|---|---|---|---|
| 8,624,677 | B2 | 1/2014 | Ueda | |
| 2009/0288852 | A1* | 11/2009 | Hirokawa | ............... H01L 24/97 174/50.52 |
| 2015/0155251 | A1* | 6/2015 | Kawakita | ................ H01L 24/05 257/773 |
| 2018/0197822 | A1* | 7/2018 | Sawamoto | .............. H01L 24/97 |

FOREIGN PATENT DOCUMENTS

| JP | H09-289269 A | 11/1997 |
|---|---|---|
| JP | H11-145344 A | 5/1999 |
| JP | H11-284101 A | 10/1999 |
| JP | 2012-195454 A | 10/2012 |

* cited by examiner

*Primary Examiner* — Cuong Q Nguyen
(74) *Attorney, Agent, or Firm* — Brinks, Gilson & Lione

(57) ABSTRACT

A hollow type semiconductor device has a pre-molded substrate (15) in which an element mounting portion, top surfaces of inner leads (2), and a top surface of frame-shaped wiring (7) are exposed on a first surface of a resin sealing body (6), and back surfaces of outer leads (3) and a back surface of a first frame-shaped wall (8) are exposed on a back surface of the resin sealing body (6). A hollow sealing body (14) including a second frame-shaped wall (9) and a sealing plate (4) is provided on the pre-molded substrate (15). The second frame-shaped wall (9) and the sealing plate (4) enclose a hollow portion (13) in which a semiconductor element (1) is kept.

16 Claims, 16 Drawing Sheets

PRE-MOLDED SUBSTRATE, METHOD OF MANUFACTURING PRE-MOLDED SUBSTRATE, AND HOLLOW TYPE SEMICONDUCTOR DEVICE

RELATED APPLICATIONS

Priority is claimed on Japanese Patent Application No. 2018-095178, filed on May 17, 2018, the content of which is incorporated herein by reference.

BACKGROUND OF THE INVENTION

1. Field of the Invention

The present invention relates to a pre-molded substrate and a hollow type semiconductor device.

2. Description of the Related Art

A resin-sealed semiconductor device, which is commonly used as a semiconductor device, employs a form in which a semiconductor element is sealed with epoxy resin, and hence thermal stress due to a difference in thermal expansion coefficient between the semiconductor element and the resin affects the semiconductor element in the process of sealing with the resin. The thermal stress varies electric characteristics of an analog semiconductor integrated circuit, such as a voltage reference element sensitive to external stress, becoming one of causes to decrease precision in detection voltage. Smallness of the thermal stress working on the element can be therefore a key to obtaining a more precise analog semiconductor product.

In order to reduce the adverse effect of the resin-originated stress on the element, for example, a method in which the surface of the semiconductor element is coated with a stress relieving film having a low elasticity (see Japanese Patent Application Laid-open No. H09-289269, for example) and a method in which the circuit design and circuit layout of the semiconductor element are improved to further reduce the adverse effect of the thermal stress (see Japanese Patent Application Laid-open No. H11-145344 and Japanese Patent Application Laid-open No. 2012-195454, for example) are proposed. Even if those measures are employed, however, the adverse effect of the resin-originated stress on the semiconductor element cannot be eliminated completely as long as a resin-sealed semiconductor device is used. An approach for eliminating the resin stress on the element is accordingly required in order to obtain an ultra-high precision analog semiconductor product having even smaller fluctuation. A hollow type semiconductor device has thus been proposed as an effective measure to achieve the objective.

As illustrated in FIG. 11, a conventional hollow type semiconductor device adopts a configuration in which a printed circuit board 20 is used as a base frame, outer leads 3 are laid on one side of the printed circuit board 20, and a semiconductor element 1 is mounted on the other side of the printed circuit board 20. A hollow sealing of the semiconductor element 1 is performed through bonding of a sealing plate 4 to an end surface of a resin frame body 21 formed to surround the semiconductor element 1 (see Japanese Patent Application Laid-open No. H11-284101, for example). The hollow type semiconductor devices of this type are applied to a voltage reference element, to optical elements such as an image sensor, and to sensing elements such as a pressure sensor, resulting in a wide use of applications including digital cameras and measuring instruments.

However, in the conventional hollow type semiconductor devices, since the frame body surrounding a hollow portion is made of a resin material, the moisture in the outside air easily permeates the thin resin frame body, making the amount of moisture reaching the surface of the semiconductor element larger than that in the case of the resin-sealed semiconductor device that does not adopt the hollow structure. The moisture reaching the semiconductor element induces deterioration (corrosion) of the wiring in the semiconductor element and bonding failure between an electrode pad on the semiconductor element and a bonding wire, resulting in one of causes to lower the reliability of the semiconductor device.

SUMMARY OF THE INVENTION

In the present invention a hollow type semiconductor device with high reliability in which moisture hardly reaches a hollow portion, and a pre-molded substrate for use in the hollow type semiconductor device are provided.

A pre-molded substrate according to one aspect of the present invention includes an element mounting portion; an inner lead provided around the element mounting portion; a frame-shaped wiring provided around the element mounting portion and the inner lead; an outer lead provided in contact with a back surface of the inner lead; a first frame-shaped wall provided in contact with a back surface of the frame-shaped wiring; and a resin sealing body provided between the inner lead and the frame-shaped wiring and between the outer lead and the first frame-shaped wall, the element mounting portion, a top surface of the inner lead, and a top surface of the frame-shaped wiring being exposed on a first surface of the resin sealing body, and a back surface of the outer lead and a back surface of the first frame-shaped wall being exposed on a second surface which is a surface opposite from the first surface.

Further, a method of manufacturing a pre-molded substrate according to another aspect of the present invention includes forming an inner lead and a frame-shaped wiring on a first principal surface of a base plate, the frame-shaped wiring surrounding the inner lead; forming an outer lead on a surface of the inner lead opposite from the first principal surface, and forming a first frame-shaped wall on a surface of the frame-shaped wiring opposite from the first principal surface, the first frame-shaped wall surrounding the outer lead; sealing the first principal surface, the inner lead, the outer lead, the frame-shaped wiring, and the first frame-shaped wall with resin; exposing a back surface of the outer lead and a back surface of the first frame-shaped wall from the resin by polishing the resin from a surface opposite from a surface of the resin that is in contact with the base plate; and exposing the inner lead, the frame-shaped wiring, and the resin by removing inside of outer periphery of the base plate from a second principal surface which opposes the first principal surface.

Further, a hollow type semiconductor device according to further another aspect of the present invention includes a semiconductor element; an element mounting portion supporting the semiconductor element; an inner lead provided around the element mounting portion, and electrically connected to the semiconductor element; a frame-shaped wiring provided around the element mounting portion and the inner lead; an outer lead provided in contact with a back surface of the inner lead; a first frame-shaped wall provided in contact with a back surface of the frame-shaped wiring; a resin sealing body provided between the inner lead and the frame-shaped wiring, and between the outer lead and the first frame-shaped wall; a second frame-shaped wall provided in contact with a surface of the frame-shaped wiring opposite from the back surface of the frame-shaped wiring; and a sealing plate provided in contact with a surface of the second frame-shaped wall opposite from a surface on which the second frame-shaped wall is in contact with the frame-shaped wiring, the element mounting portion, the inner lead, and the frame-shaped wiring being exposed on a first surface of the resin sealing body, and the outer lead and the first frame-shaped wall being exposed on a second surface which is a surface opposite from the first surface.

Further, a method of manufacturing a hollow type semiconductor device according to further another aspect of the invention includes forming an inner lead and a frame-shaped wiring on a first principal surface of a base plate, the frame-shaped wiring surrounding the inner lead; forming an outer lead on a surface of the inner lead opposite from the first principal surface, and forming a first frame-shaped wall on a surface of the frame-shaped wiring opposite from the first principal surface, the first frame-shaped wall surrounding the outer lead; sealing the first principal surface, the inner lead, the outer lead, the frame-shaped wiring, and the first frame-shaped wall with resin; exposing a back surface of the outer lead and a back surface of the first frame-shaped wall from the resin by polishing the resin from a surface opposite from a surface of the resin that is in contact with the base plate; exposing the inner lead, the frame-shaped wiring, and the resin by removing inside of outer periphery of the base plate from a second principal surface which opposes the first principal surface; forming a second frame-shaped wall on the exposed surface of the frame-shaped wiring; mounting a semiconductor element on an element mounting portion inside the frame-shaped wiring; electrically connecting the semiconductor element and the inner lead; forming a hollow sealing body having a hollow portion enclosed by a sealing plate, the second frame-shaped wall, and the resin, by bonding the sealing plate to a top surface of the second frame-shaped wall; and dividing the hollow sealing body into individual pieces.

A hollow type semiconductor device with high reliability can be obtained in which moisture hardly reaches the hollow portion and is hence less liable to induce deterioration (corrosion) of the wiring in the semiconductor element and bonding failure between the electrode pad on the semiconductor element and the bonding wire, as well as the pre-molded substrate to be used in the hollow type semiconductor device.

BRIEF DESCRIPTION OF THE DRAWINGS

FIG. 1A is a perspective view of the semiconductor device when viewed from the semiconductor element mounting side (before bonding a sealing plate);

FIG. 1B is a perspective view of the semiconductor device when viewed from the semiconductor element mounting side (after bonding the sealing plate); and FIG. 1C is a perspective view of the semiconductor device when viewed from the outer lead side.

FIG. 2A is a view seen into the semiconductor device from a top surface on the semiconductor element mounting side; and FIG. 2B is a sectional view taken along the line A-A of FIG. 2A.

FIG. 3A is a perspective view of the semiconductor device when viewed from the semiconductor element mounting side before bonding sealing plate; and FIG. 3B is a perspective view of the semiconductor device when viewed from the semiconductor element mounting side after bonding the sealing plate.

FIG. 4A is a view prior to reflow processing; and

FIG. 4B is a view after the reflow processing.

FIG. 5A is a perspective view of the semiconductor device when viewed from the semiconductor element mounting side (prior to sealing second resin);

FIG. 5B is a perspective view of the semiconductor device when viewed from the semiconductor element mounting side (after sealing second resin); and FIG. 5C is a sectional view taken along the line C-C.

DETAILED DESCRIPTION OF THE PREFERRED EMBODIMENTS

Now, embodiments of the present invention are described with reference to the drawings.

Figure 1A:
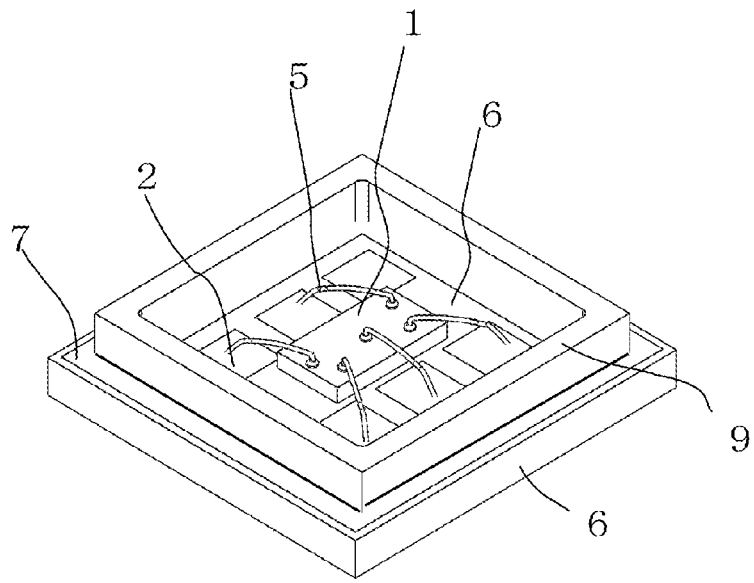
FIG. 1A to FIG. 1C are diagrams for illustrating the structure of a hollow type semiconductor device according to a first embodiment of the present invention.
Figure 1B:
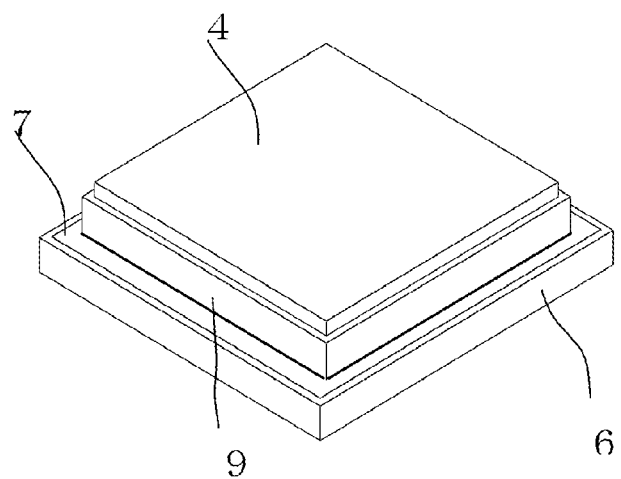
Figure 1C:
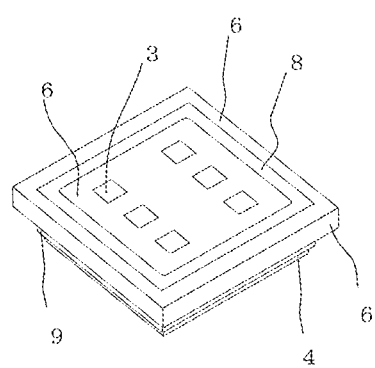

FIG. 1A to FIG. 1C are diagrams for illustrating the structure of a hollow type semiconductor device according to the first embodiment of the present invention. FIG. 1A is a perspective view of the hollow type semiconductor device when viewed from the semiconductor element mounting side before bonding a sealing plate. A semiconductor element 1, for example, a voltage reference element, is mounted on a front surface of a resin sealing body 6, and a plurality of inner leads 2 are arranged apart around the semiconductor element 1 at a distance. Only front surfaces of the inner leads 2 are exposed from the resin sealing body 6, and side surfaces of the inner leads 2 are embedded in the resin sealing body 6. The inner leads 2 are electrically connected, with metal lines 5, to a plurality of electrode pads provided on a surface of the semiconductor element 1. A frame-shaped wiring 7 exposed from the resin sealing body 6 is provided around the plurality of inner leads 2, and a second frame-shaped wall 9 is provided on a top surface of the frame-shaped wiring 7.

FIG. 1B is a perspective view of the hollow type semiconductor device when viewed from the semiconductor element mounting side after the sealing plate is bonded. A sealing plate 4 is bonded to a top end surface of the second frame-shaped wall 9 to form a hollow portion enclosed by a back surface of the sealing plate 4, inner surfaces of the second frame-shaped wall 9, and the upper surface of the resin sealing body 6.

FIG. 1C is a perspective view of the hollow type semiconductor device when viewed from the outer lead side. A plurality of outer leads 3 and a first frame-shaped wall 8 are exposed from the resin sealing body 6. Only back surfaces of the plurality of outer leads 3 and the first frame-shaped wall 8 are exposed from the resin sealing body 6, and side surfaces of the outer leads 3 and the first frame-shaped wall 8 are embedded in the resin sealing body 6. The outer leads 3 and the inner leads 2 are joined within the resin sealing body 6. Similarly, the first frame-shaped wall 8 is joined to the frame-shaped wiring 7 within the resin sealing body 6. In plan view, the resin sealing body 6 is formed in a peripheral portion of the hollow type semiconductor device, the first frame-shaped wall 8 is formed in a circulatory pattern inside the peripheral portion, and the plurality of outer leads 3 are formed further inside the first frame-shaped wall 8. The back surface of the resin sealing body 6, the back surface of the first frame-shaped wall 8, and the back surfaces of the outer leads 3 are in the same plane.

A plating layer (not shown) for assembling is formed on the back surface of the first frame-shaped wall 8 and the outer leads 3. When the hollow type semiconductor device is assembled on a mounting board, the plurality of outer leads 3 and the first frame-shaped wall 8 exposed from the resin sealing body 6 serve as an assembling surface which is bonded to the mounting board.

Figure 2A:
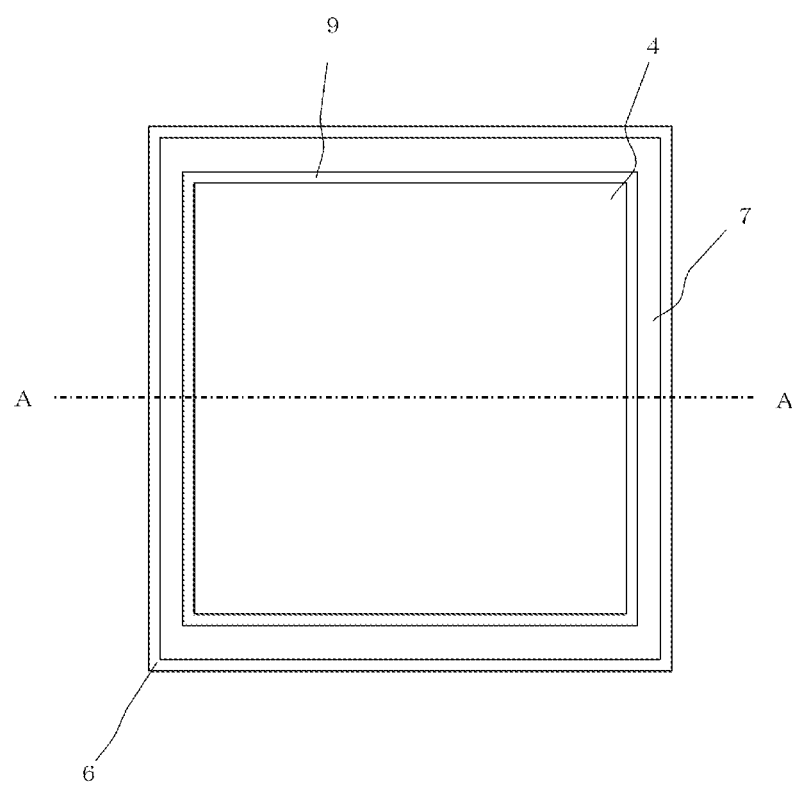
FIGS. 2A and 2B are diagrams for illustrating the structure of the hollow type semiconductor device according to the first embodiment of the present invention.
Figure 2B:
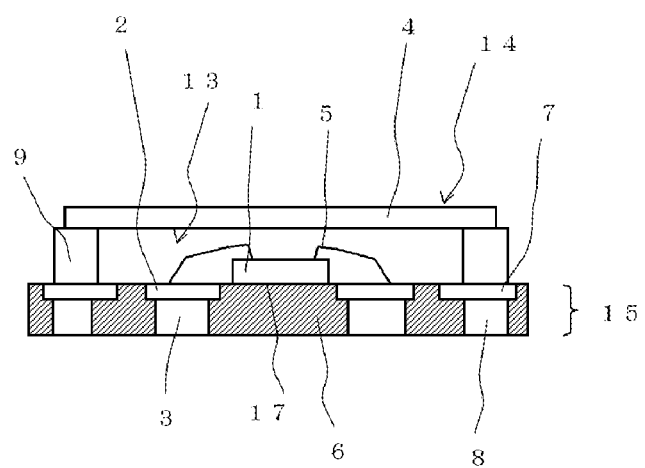

FIG. 2A and FIG. 2B are diagrams for illustrating the structure of the hollow type semiconductor device according to the first embodiment of the present invention, and are a plan view and a sectional view, respectively. FIG. 2A is a plan view when viewed from the sealing plate 4 side of the hollow type semiconductor device. The resin sealing body 6 is formed in the peripheral portion of the hollow type semiconductor device, the frame-shaped wiring 7 is formed in a circulatory pattern inside the peripheral portion, the second frame-shaped wall 9 is formed in a circulatory pattern inside the frame-shaped wiring 7, and the sealing plate 4 rests on a top end of the second frame-shaped wall 9.

FIG. 2B is a sectional view taken along the line A-A of FIG. 2A. A pre-molded substrate 15 is formed in a lower part of the hollow type semiconductor device. The pre-molded substrate 15 has a configuration in which the inner leads 2, the outer leads 3, the frame-shaped wiring 7, and the first frame-shaped wall 8 are embedded in the resin sealing body 6, with the leads, the wiring, and the wall partially exposed from the resin sealing body 6. An element mounting portion 17 on which the semiconductor element 1 is mounted is formed around the center of a top surface of the pre-molded substrate 15 according to a first embodiment of the present invention, and the inner leads 2 are provided around the element mounting portion 17 at a distance from the element mounting portion 17. The element mounting portion 17 may be the resin sealing body 6 as in FIG. 2B or may be a metal body.

The inner leads 2 are exposed only on upper surfaces from the resin sealing body 6, and side surfaces of the inner leads 2 are embedded in the resin sealing body 6. The back surfaces of the inner leads 2 are joined by the upper surfaces of the outer leads 3. The side surfaces of the outer leads 3 are embedded in the resin sealing body 6, and the back surfaces of the outer leads 3 are exposed from the resin sealing body 6. The back surfaces of the inner leads 2 are given an area larger than the area of the upper surfaces of the outer leads 3 to prevent falling of the inner leads 2 and the outer leads 3 from the resin sealing body 6.

The frame-shaped wiring 7 is formed around the inner leads 2 at a distance from the inner leads 2. Similarly to the inner leads 2 the upper surface of the frame-shaped wiring 7 is exposed from the resin sealing body 6, and the side surfaces of the frame-shaped wiring 7 are embedded in the resin sealing body 6. The back surface of the frame-shaped wiring 7 is joined by the upper surface of the first frame-shaped wall 8. The side surfaces of the frame-shaped wall 8 are embedded in the resin sealing body 6, and the back surface of the frame-shaped wall 8 is exposed from the resin sealing body 6. The back surface of the frame-shaped wiring 7 is given an area larger than the area of the upper surface of the first frame-shaped wall 8 to prevent falling of the frame-shaped wiring 7 and the first frame-shaped wall 8 from the resin sealing body 6. The frame-shaped wiring 7 and the first frame-shaped wall 8 are made of a non-moisture permeable material and are formed along the peripheral of the pre-molded substrate 15 in a circulatory pattern without a break. The use of a non-moisture permeable material reduces the absorption of moisture from side surfaces of the pre-molded substrate 15 into portions of the resin sealing body 6 that locate inside the frame-shaped wiring 7 and the first frame-shaped wall 8, thereby suppressing moisture to reach the interior. The resin sealing body 6 is provided outside the frame-shaped wiring 7 and the first frame-shaped wall 8 as well in the pre-molded substrate 15 of the present embodiment of the present invention.

The upper surfaces of the inner leads 2, the upper surface of the frame-shaped wiring 7, and the upper surface of the resin sealing body 6 are on the same plane. The back surfaces of the outer lead 3, the back surface of the first frame-shaped wall 8, and the back surface of the resin sealing body 6 are on the same plane. The inner leads 2 and the frame-shaped wiring 7 have the same thickness (height). The outer leads 3 and the first frame-shaped wall 8 also have the same thickness (height).

The semiconductor element 1 and a hollow sealing body 14 are provided on the pre-molded substrate 15 described above to complete the hollow type semiconductor device. The semiconductor element 1 is mounted around the center of the upper surface of the pre-molded substrate 15, and the electrode pads on the semiconductor element 1 are electrically connected to the upper surfaces of the inner leads 2 by the metal lines 5. Flip chip bonding may be employed instead of connection by the metal lines 5.

The second frame-shaped wall 9 is provided in a circulatory pattern on the upper surface of the frame-shaped wiring 7 located around the inner leads 2. The sealing plate 4 shaped like a flat board is bonded to the upper surface of the second frame-shaped wall 9 via solder or a similar bonding material. A contact between the sealing plate 4 and the metal lines 5 can be avoided by giving the second frame-shaped wall 9 a thickness (height) greater than the height of loops of the metal lines 5. A hollow portion 13 which is an enclosure created by the second frame-shaped wall 9, the sealing plate 4, and the resin sealing body 6 is formed inside the hollow sealing body 14, and the semiconductor element 1 unsealed with resin is mounted inside the hollow portion 13.

Materials used in the components are described next.

A copper-based alloy or a similar metal is used for the inner leads 2, the outer leads 3, and the frame-shaped wiring 7. Thermally curable epoxy resin containing a light shielding component is used for the resin sealing body 6 in which the inner leads 2, the outer leads 3, and the frame-shaped wiring 7 are embedded. A non-moisture permeable material is suitable for the first frame-shaped wall 8 and the second frame-shaped wall 9. The non-moisture permeable material may be a copper-based alloy or a similar metal or may be ceramics or glass.

A layered film having a nickel layer, a palladium layer, and a gold layer is formed as a plating film on the back surfaces of the outer leads 3 and the first frame-shaped wall 8 which are exposed from the resin sealing body 6. Another layered film having a nickel layer, a palladium layer, and a gold layer is formed as a plating film on the upper surfaces of the inner leads 2 and the frame-shaped wiring 7 which are exposed from the resin sealing body 6 on the element forming side. The layered film formed on the upper surfaces of the inner leads 2 is a film for enhancing the connectivity of the inner leads 2 to the metal wires 5 provided between the semiconductor element 1 and the inner leads 2. Portions of this layered film that are formed on the front surfaces of the frame-shaped wiring 7 and the second frame-shaped wall 9 are used as a bonding film when the sealing plate 4 made of metal, for example, a copper material, is soldered for hollow sealing, and also has an effect of preventing the oxidation of copper which is the host material of the frame-shaped wiring 7 and the second frame-shaped wall 9.

The hollow type semiconductor device described above is structured so that the hollow sealing body is provided on the pre-molded substrate resistant to moisture absorption, and is accordingly a hollow type semiconductor device with high reliability in which moisture hardly reaches the hollow portion and consequently has little chance of inducing deterioration (corrosion) of the wiring in the semiconductor element and bonding failure between the electrode pads on the semiconductor element and the bonding wire.

Figure 3A:
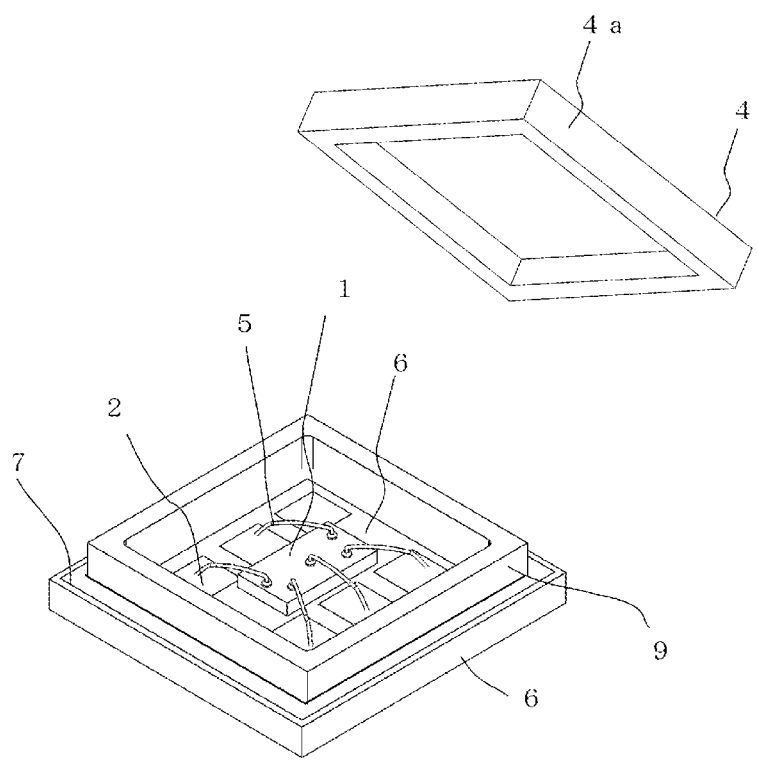
FIGS. 3A and 3B are diagrams for illustrating the structure of a hollow type semiconductor device according to a second embodiment of the present invention.
Figure 3B:
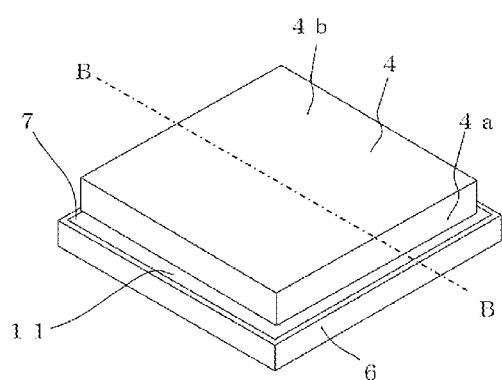
Figure 4A:
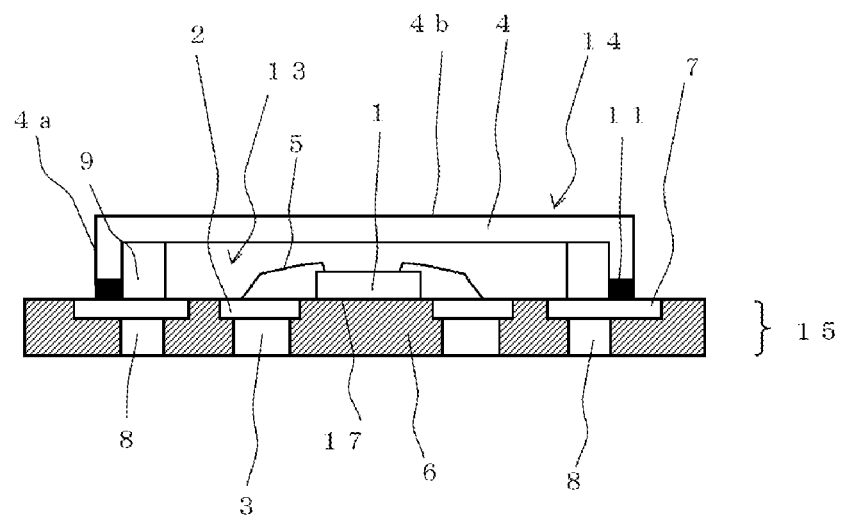
FIGS. 4A and 4B are diagrams for illustrating the structure of the hollow type semiconductor device according to the second embodiment of the present invention, and are sectional views taken along the line B-B of FIG. 3B.
Figure 4B:
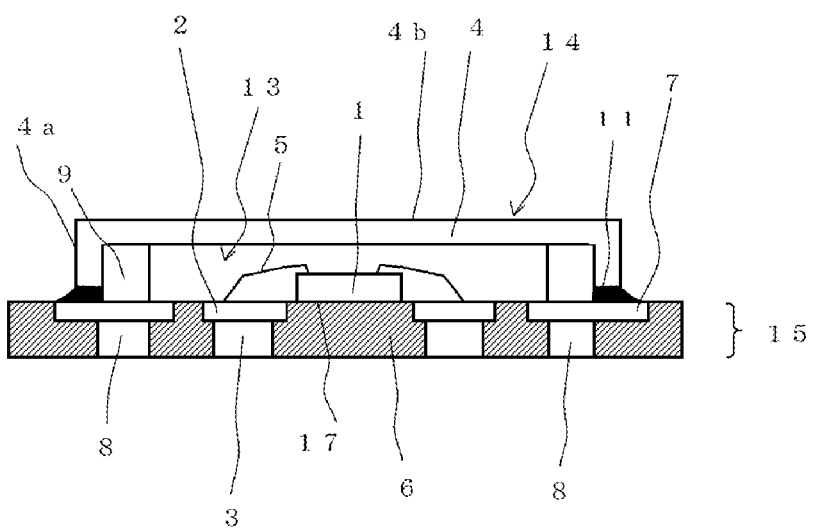

FIG. 3A and FIG. 3B are diagrams for illustrating the structure of a hollow type semiconductor device according to the second embodiment of the present invention. FIG. 3A is a perspective view of the hollow type semiconductor device when viewed from the semiconductor element mounting side before bonding a sealing plate, and FIG. 3B is a perspective view of the hollow type semiconductor device when viewed from the semiconductor element mounting side after the sealing plate is bonded. A difference from the hollow type semiconductor device according to the first embodiment of the present invention is the shape of the sealing plate 4. The sealing plate 4 used in the first embodiment is shaped like a flat board, whereas the sealing plate 4 used in the second embodiment has an outer edge portion 4a along the peripheral of a flat board portion 4b. The outer edge portion 4a is formed to be perpendicular to the flat board portion 4b, and sealing is conducted so that a back surface of the flat board portion 4b covers the upper surface of the second frame-shaped wall 9 while inner side surfaces of the outer edge portion 4a cover outer side surfaces of the second frame-shaped wall 9. FIG. 4A and FIG. 4B are sectional views taken along the line B-B of FIG. 3B. FIG. 4A is a sectional view prior to reflow processing, and FIG. 4B is a sectional view after reflow processing.

First, as illustrated in FIG. 4A, solder 11 is formed in advance on an end surface of the outer edge portion 4a of the sealing plate 4. Next, as illustrated in FIG. 4B, a part of the side surfaces of the second frame-shaped wall 9, a part of the front surface of the frame-shaped wiring 7, and the end surface of the outer edge portion 4a of the sealing plate 4 are bonded by the solder 11 through reflow processing to form a hollow sealing body. A layered film having a nickel layer, a palladium layer, and a gold layer is formed on surfaces of copper which is the host material of the second frame-shaped wall 9 and the frame-shaped wiring 7 to prevent the oxidation of the surfaces of copper as the host material and improve the bond to the end surface of the outer edge portion 4a of the sealing plate 4 which is provided by the solder 11. With the outer edge portion 4a formed in the sealing plate 4, solder bonding of the sealing plate 4 is conducted in a place even more distant from the mounting portion of the semiconductor element 1. This prevents a residue of a soldering flux from infiltrating the hollow portion in which the semiconductor element 1 is mounted and accomplishes more stable solder bonding as well.

While the hollow type semiconductor device according to the first embodiment and the hollow type semiconductor device according to the second embodiment use a copper material or a similar metal for the sealing plate 4, the sealing plate 4 is only required to be a transparent plate transmissive of light when the semiconductor element 1 is an optical system element. A glass plate or a transparent resin plate is used as the transparent plate and is only required to be bonded to the upper surface of the second frame-shaped wall 9 with a silicone-based adhesive.

Figure 5A:
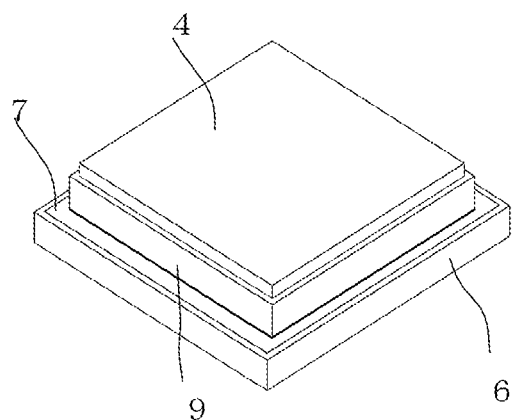
FIG. 5A to FIG. 5C are diagrams for illustrating the structure of a hollow type semiconductor device according to a third embodiment of the present invention.
Figure 5B:
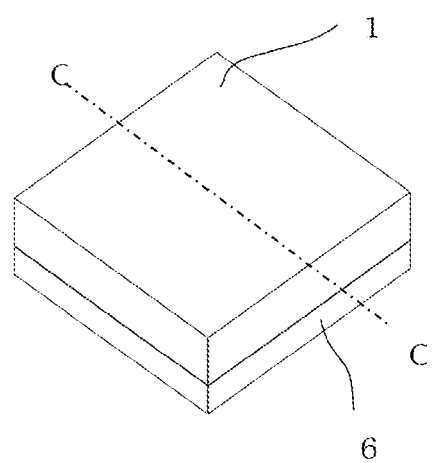
Figure 5C:
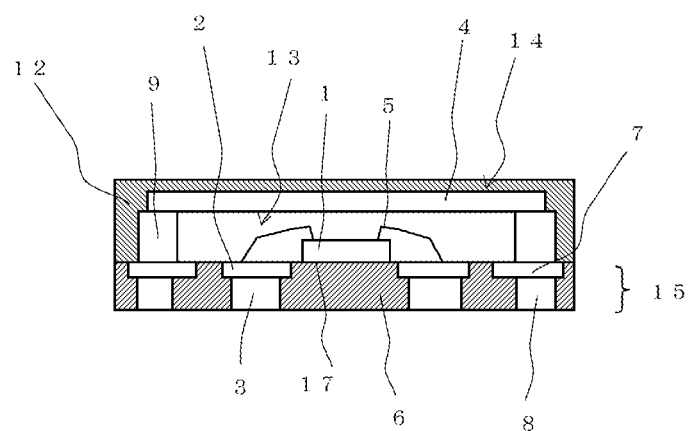

FIG. 5A to FIG. 5C are diagrams for illustrating the structure of a hollow type semiconductor device according to a third embodiment of the present invention. FIG. 5A is a perspective view of the hollow type semiconductor device when viewed from the semiconductor element mounting side prior to second resin sealing and is the same view as FIG. 1B. A mode in which a surface of the hollow sealing body is covered with a second resin sealing body is illustrated in FIG. 5B. A top portion of the hollow type semiconductor device shaped like a rectangular solid is covered with a second resin sealing body 12. Different types of resin may be used for the second resin sealing body 12 at the upper and the resin sealing body 6 at the bottom by taking stress into consideration.

FIG. 5C is a sectional view taken along the line C-C of FIG. 5B. The second resin sealing body 12 is formed to cover outer surfaces of the hollow sealing body 14, namely, the upper surface and side surfaces of the sealing plate 4 and the side surfaces and upper surface of the second frame-shaped wall 9. The second resin sealing body 12 covers the hollow sealing body 14 so that outer side surfaces of the second resin sealing body 12 and outer side surfaces of the resin sealing body 6 are on the same plane, thereby making the hollow type semiconductor device into a rectangular solid. With the outside of the hollow sealing body covered with resin, the ease of handling in assembling is enhanced and the hollow type semiconductor device is protected even better. General thermally curable epoxy resin containing a light shielding component is used for the second resin sealing body 12 as in the case for the resin sealing body 6.

The hollow type semiconductor device according to the second embodiment may be covered with the second resin sealing body 12 as in the case described above. When an optical system element is employed as the semiconductor element 1, however, the sealing plate 4 is required to be transparent. The second resin sealing body 12 in this case covers only the side surfaces and top surface of the second frame-shaped wall 9, the side surfaces of the sealing plate 4, and a part of the top surface of the sealing plate 4, and has a window opened above the semiconductor element 1 to transmit light.

A method of manufacturing the hollow type semiconductor device according to the first embodiment of the present invention is described next with reference to FIG. 6A to FIG. 8C.

Figure 6A:
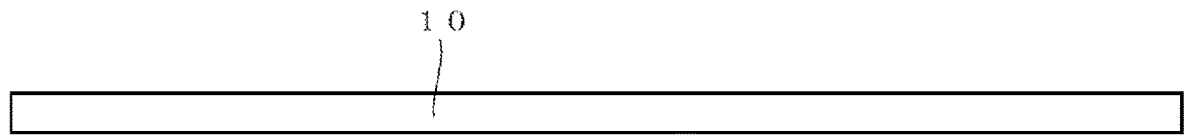
FIG. 6A to FIG. 6D are sectional views along the process flow for illustrating a method of manufacturing the hollow type semiconductor device according to the first embodiment of the present invention.

As illustrated in FIG. 6A, a base plate 10 is prepared first. The base plate 10 is an iron-based steel plate having a length of 250 mm, a width of 80 mm, and a thickness of 250 μm. A copper-based alloy material or a nickel-based alloy material may be used for the base plate 10. A plate made of ceramics or fiber reinforced plastic (FRP) which is an insulator, or a plate made of polyimide or a similar organic material may also be used.

Figure 6B:
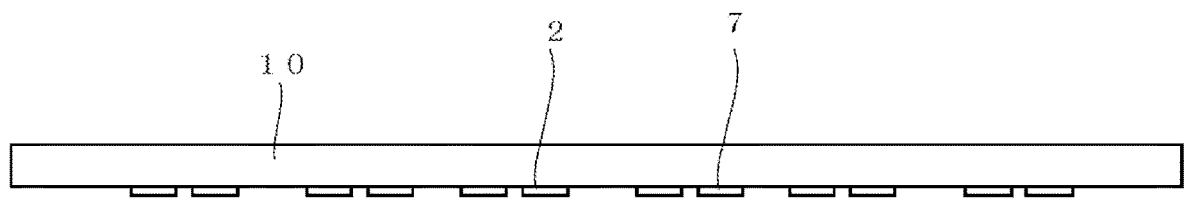

Next, as illustrated in FIG. 6B, a wiring pattern having a thickness of 30 μm is formed as the plurality of copper inner leads 2 and as the copper frame-shaped wiring 7 on one of principal surfaces of the base plate 10 by electrolytic plating or electroless plating.

Figure 6C:
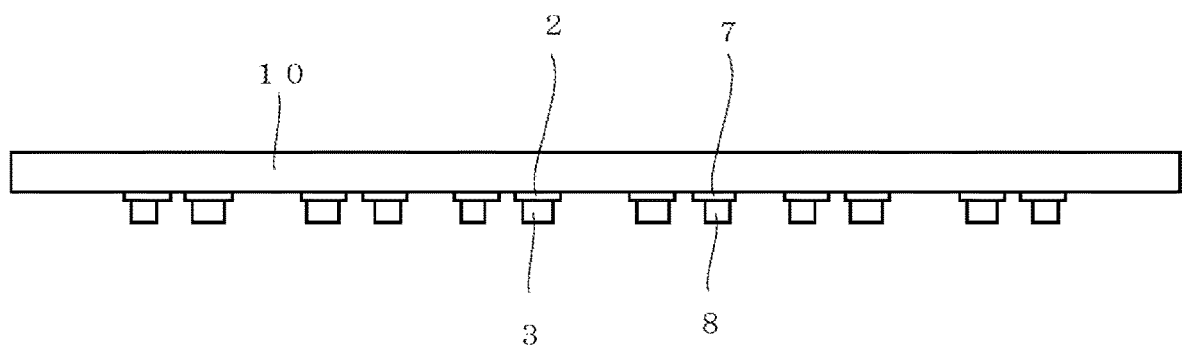

As illustrated in FIG. 6C, a pattern having a thickness of 80 μm is then formed as the outer leads 3 and as the first frame-shaped wall 8 by electrolytic plating or electroless plating on a part of the front surfaces of the inner leads 2 on the opposite side from the base plate 10 and a part of the front surface of the frame-shaped wiring 7 on the opposite side from the base plate 10. The outer leads 3 and the first frame-shaped wall 8 are formed from a single-layer material having a layer of one of gold, silver, copper, tin, aluminum, palladium, and nickel, or a multi-layer metal material in which a plurality of materials selected from those metals are layered, or an alloy of a plurality of materials selected from those metals.

Figure 6D:
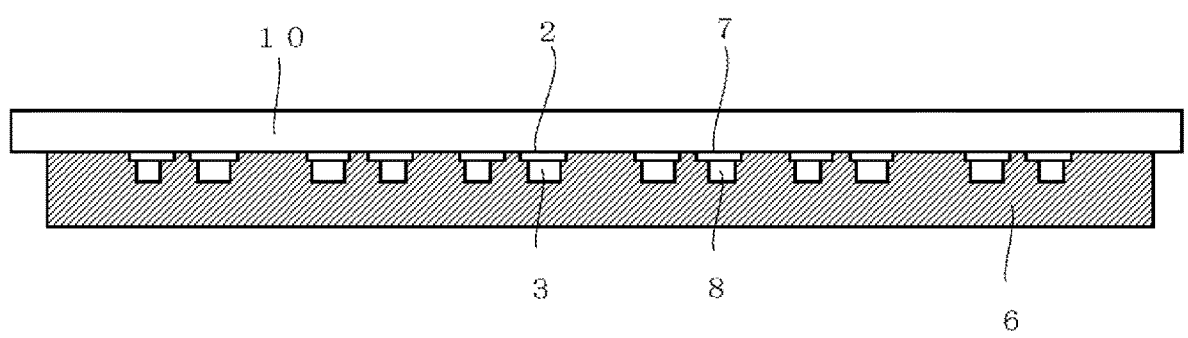

As illustrated in FIG. 6D, the one of the principal surfaces of the base plate 10 on which the inner leads 2, the frame-shaped wiring 7, the first frame-shaped wall 8, and the outer leads 3 have been formed is subsequently sealed with resin by transfer molding to form the resin sealing body 6 having a resin thickness of about 200 μm. The resin sealing body 6 is made of general thermally curable epoxy resin containing a light shielding component which is used for sealing semiconductor elements.

Figure 7A:
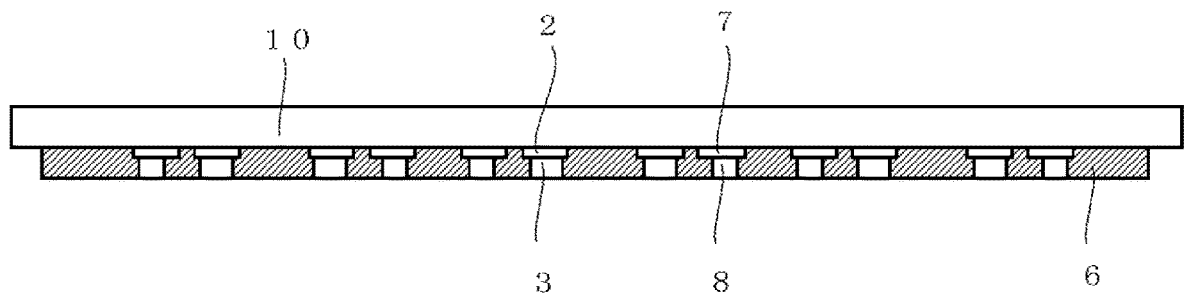
FIG. 7A to FIG. 7D are sectional views along the process flow continued from FIG. 6D to illustrate the method of manufacturing the hollow type semiconductor device according to the first embodiment of the present invention.
Figure 7B:
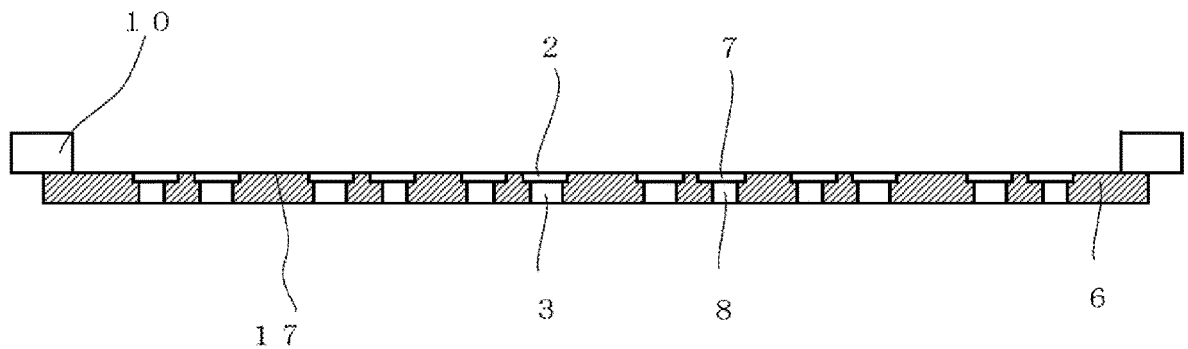

As illustrated in FIG. 7A, the resin sealing body 6 is polished next from its front surface on the opposite side from a surface of the resin sealing body 6 that is in contact with the base plate 10 to expose the back surfaces of the outer leads 3 and the first frame-shaped wall 8 (the assembling surface). As illustrated in FIG. 7B, the other principal surface of the base plate 10 except an outer periphery is removed next by etching to form an opening in which the top surfaces of the resin sealing body 6, the inner leads 2, and the frame-shaped wiring 7 are exposed. A pre-molded substrate on which semiconductor elements can be mounted at once is thus completed. Warping of the pre-molded substrate can be avoided by leaving the outer periphery of the base plate 10. The resin sealing body 6 is cut between the frame-shaped wiring 7 and its adjacent frame-shaped wiring 7 to complete pre-molded substrates, each of which has a semiconductor element individually mounted thereon.

Figure 7C:
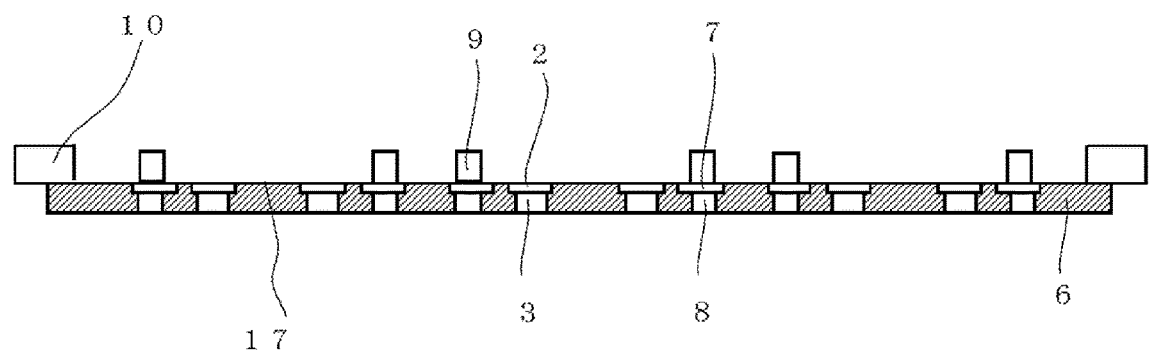

The following description is about a process using the pre-molded substrate on which a plurality of semiconductor elements can be mounted at once. As illustrated in FIG. 7C, the second frame-shaped wall 9 having a thickness of 200 μm is formed on a part of the top surface of the frame-shaped wiring 7 connected to the first frame-shaped wall 8. The second frame-shaped wall 9 is formed from a single-layer material having a layer of one of gold, silver, copper, tin, aluminum, palladium, and nickel, or a multi-layer metal material in which a plurality of materials selected from those metals are layered, or an alloy of a plurality of materials selected from those metals. A layered film is then formed as a plating film by layering a nickel layer, a palladium layer, and a gold layer in the stated order through electrolytic plating, on the back surfaces of the outer leads 3 (the assembling surface), the top surfaces (exposed surfaces) of the inner leads 2, the top surface (exposed surface) of the frame-shaped wiring 7, and the front surface of the second frame-shaped wall 9.

Figure 7D:
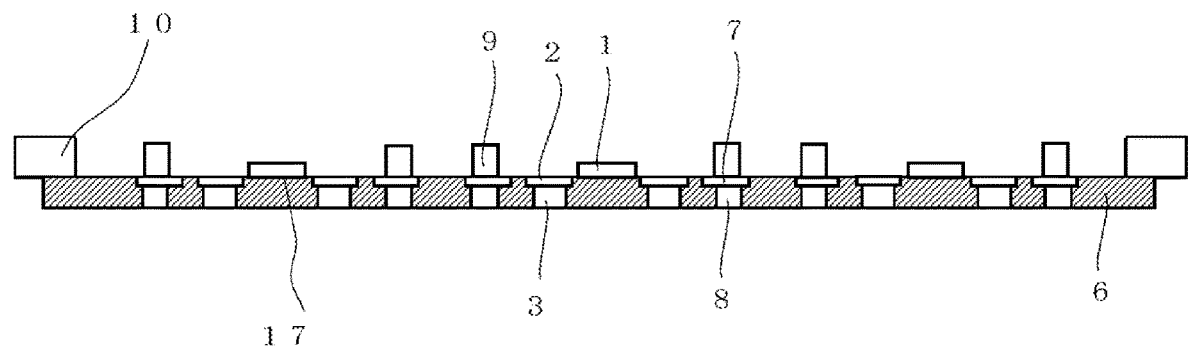
Figure 8A:
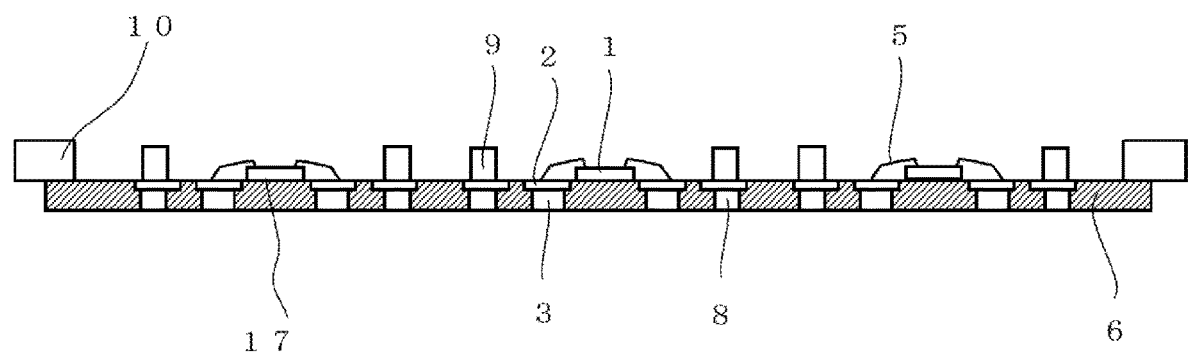
FIG. 8A to FIG. 8C are sectional views along the process flow continued from FIG. 7D to illustrate the method of manufacturing the hollow type semiconductor device according to the first embodiment of the present invention.

As illustrated in FIG. 7D, each semiconductor element 1 is fixed next to the element mounting portion 17 around the center of an area enclosed by the second frame-shaped wall 9, with use of a die attach film or a similar adhesive. As illustrated in FIG. 8A, electrode pads provided on the front surface of the semiconductor element 1 are connected next to the inner leads 2 via the metal wires 5 by wire bonding.

Figure 8B:
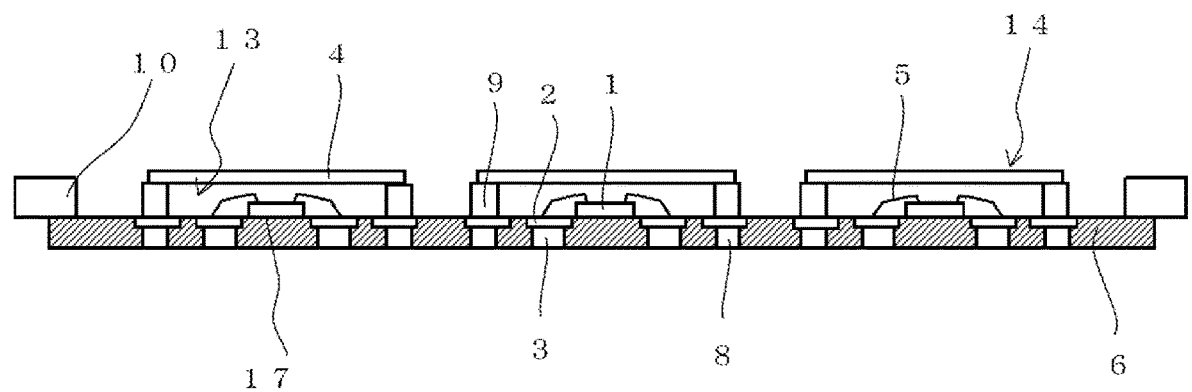
Figure 8C:
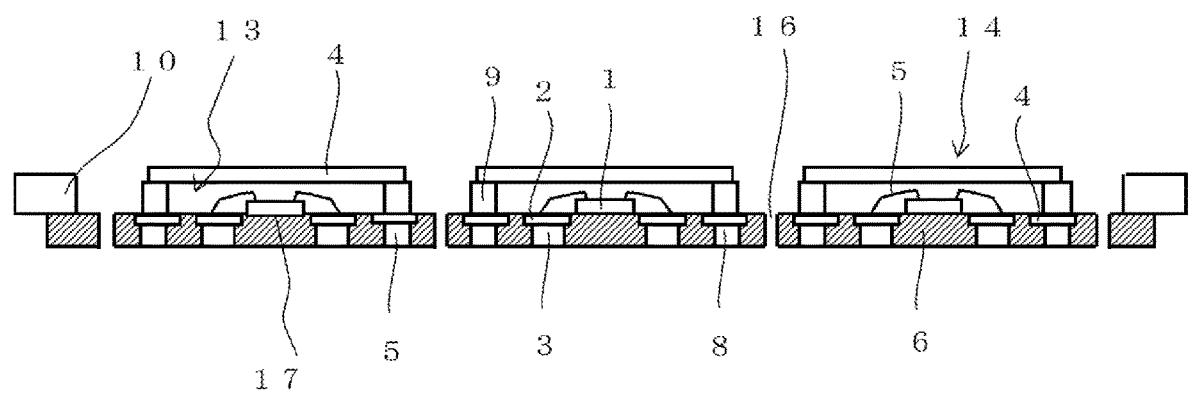

Next, as illustrated in FIG. 8B, the copper sealing plate 4 is bonded to the top surface of the second frame-shaped wall 9 with an adhesive or solder to perform hollow sealing. A transparent sealing plate 4 made of glass or the like is used instead of a copper sealing plate when the element to be mounted is an image sensor or a similar optical element. Lastly, as illustrated in FIG. 8C, the resin sealing body 6 between one first frame-shaped wall 8 and its adjacent first frame-shaped wall 8 is cut with a dicing blade, and the outer periphery of the base plate 10 is further cut off to finish an individual piece as the hollow type semiconductor device. Blade dicing may be replaced with breaking or laser cutting as a method of dividing the substrate into individual pieces.

The hollow type semiconductor device manufactured by the manufacturing method described above is structured so that the hollow sealing body is provided on the pre-molded substrate resistant to moisture absorption, and can accordingly be a hollow type semiconductor device with high reliability in which moisture hardly reaches the hollow portion and consequently has little chance of inducing deterioration (corrosion) of the wiring in the semiconductor element and bonding failure between the electrode pads on the semiconductor element and the bonding wire.

Since the hollow type semiconductor device according to one embodiment of the present invention uses a pre-molded substrate in place of a printed circuit board, the cost of the material of the substrate can be also reduced. In addition, the use of electrolytic plating to form the frame body forming the hollow portion renders a mold for resin molding unnecessary and eliminates the need to newly fabricate a special mold each time the size of the semiconductor device changes. The method of manufacturing the hollow type semiconductor device according to one embodiment of the present invention thus contributes to a reduction of cost in mass production as well.

A method of manufacturing a hollow type semiconductor device according to a second embodiment is described next.

Figure 9A:
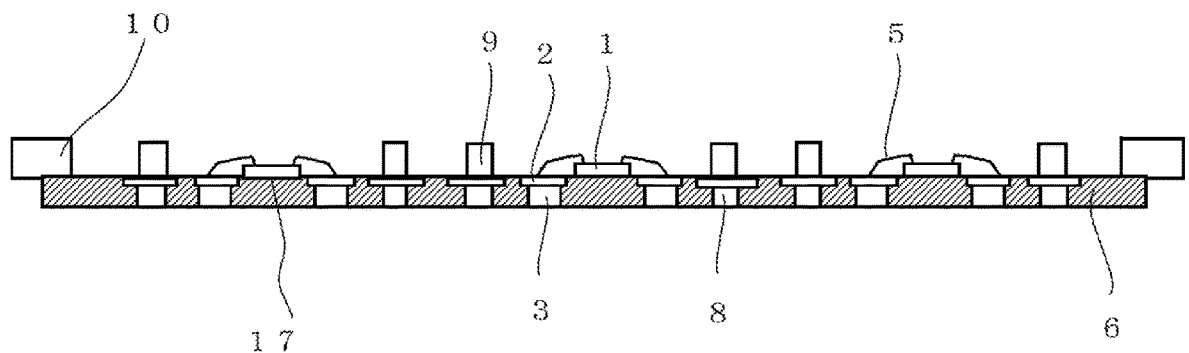
FIG. 9A to FIG. 9C are sectional views along the process flow for illustrating a method of manufacturing the hollow type semiconductor device according to the second embodiment of the present invention.
Figure 9B:
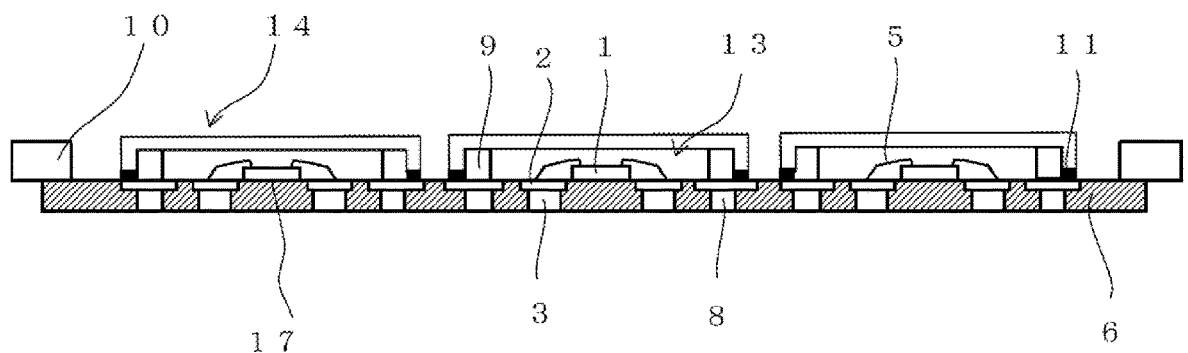
Figure 9C:
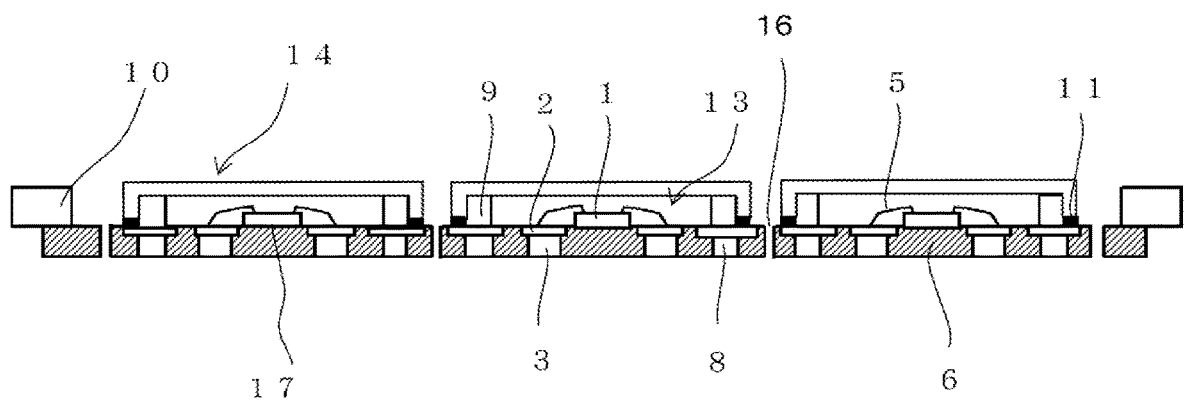

FIG. 9A to FIG. 9C are sectional views along the process flow for illustrating a method of manufacturing the hollow type semiconductor device according to the second embodiment of the present invention. FIG. 9A is a view for illustrating a manufacturing step that precedes hollow sealing with the sealing plate 4 and is the same view as FIG. 8A in the first embodiment. FIG. 9B is a view for illustrating sealing with the sealing plate 4 that has the outer edge portion 4a. The sealing plate 4 has the outer edge portion 4a formed from a 200 μm-thick copper plate. The end surface of the outer edge portion 4a of the sealing plate 4 is coated with the solder 11 in advance, the sealing plate 4 is fitted along the peripheral of the second frame-shaped wall 9, and solder reflow processing is then executed. The solder-coated surface of the sealing plate 4, a part of the front surface of the frame-shaped wiring 7, and a part of the front surface of the second frame-shaped wall 9 are bonded with the solder in this manner, thereby completing hollow sealing. A flux is desirably applied to the solder-coated surface prior to the reflow processing in order to accomplish more secure solder bonding. As illustrated in FIG. 9C, the substrate is next divided by blade dicing into individual pieces each of which is a hollow sealing body, thereby completing each individual hollow type semiconductor device.

A method of manufacturing the hollow type semiconductor device according to the third embodiment is described next.

Figure 10A:
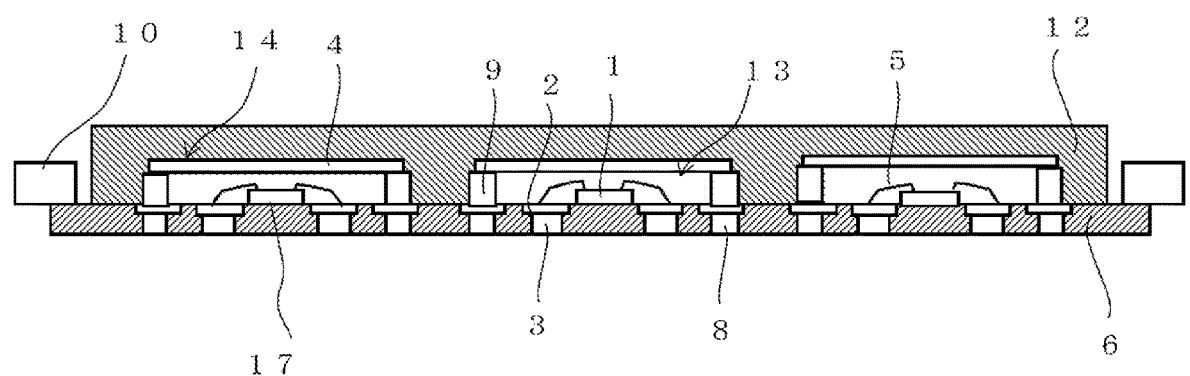
FIGS. 10A and 10B are sectional views along the process flow for illustrating a method of manufacturing the hollow type semiconductor device according to the third embodiment of the present invention.

FIG. 8B used for the description of the manufacturing method according to the first embodiment is a view for illustrating a state before dividing the substrate into individual pieces. The front surface of this hollow sealing body is sealed with resin by transfer molding to be covered with the second resin sealing body 12. This state is illustrated in FIG. 10A. The second resin sealing body 12 is formed to cover the sealing plate 4, the second frame-shaped wall 9, and a part of the resin sealing body 6, serving as the hollow sealing body 14. With the outside of the hollow sealing body 14 covered with resin, the ease of handling in assembling is enhanced, and the hollow type semiconductor device is protected even better. The second resin sealing body 12 is made of general thermally curable epoxy resin containing a light shielding component as in the resin sealing body 6 but may be made of transparent resin to suit requested characteristics.

Figure 10B:
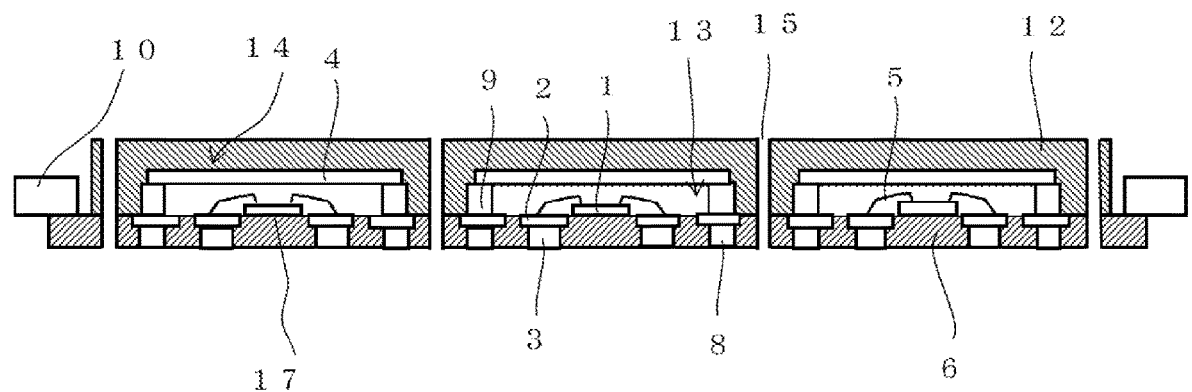
Figure 11:
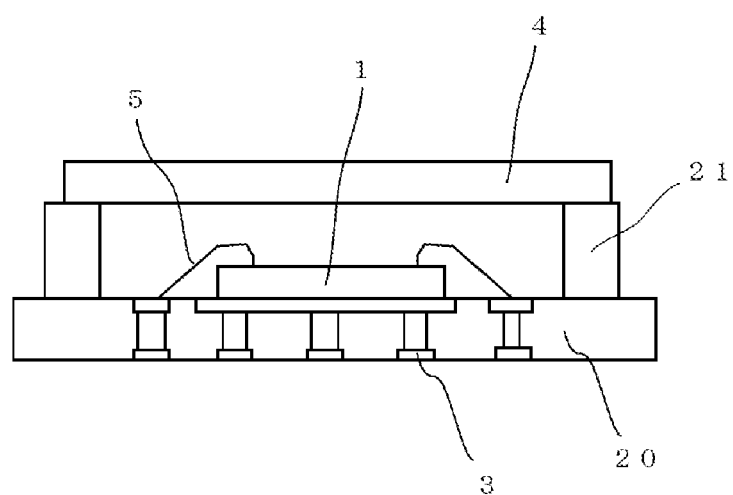
FIG. 11 is a sectional view for illustrating a hollow type semiconductor device in related art.

Before the integral molding using the second resin sealing body 12 is conducted, the surfaces of the inner leads 2, the frame-shaped wiring 7, and the resin sealing body 6 that are exposed in the opening formed by the etching of the base plate 10 and the front surface of the hollow sealing body 14 may be cleaned by plasma treatment or other methods. The cleaning enhances resin adhesion at the interface, and a highly reliable second resin sealing body 12 can accordingly be obtained. Transfer molding may be replaced with potting or pressing as a method of forming the second resin sealing body 12. Lastly, as illustrated in FIG. 10B, blade dicing is used to separate one hollow sealing body 14 from its adjacent hollow sealing body 14, thereby finishing each individual piece as the hollow type semiconductor device.

What is claimed is:

1. A pre-molded substrate, comprising:
an element mounting portion;
an inner lead provided around the element mounting portion;
a frame-shaped wiring provided around the element mounting portion and the inner lead;
an outer lead provided in contact with a back surface of the inner lead;
a first frame-shaped wall provided in contact with a back surface of the frame-shaped wiring; and
a resin sealing body provided between the inner lead and the frame-shaped wiring and between the outer lead and the first frame-shaped wall,
the element mounting portion, a top surface of the inner lead, and a top surface of the frame-shaped wiring being exposed on a first surface of the resin sealing body, and
a back surface of the outer lead and a back surface of the first frame-shaped wall being exposed on a second surface which is a surface opposite from the first surface.

2. The pre-molded substrate according to claim 1, wherein the inner lead is larger in size than the outer lead in plan view.

3. The pre-molded substrate according to claim 1, wherein the frame-shaped wiring is larger in size than the first frame-shaped wall in plan view.

4. The pre-molded substrate according to claim 1, wherein the outer lead and the first frame-shaped wall are each formed from one of a single-layer material having a layer of one of metals that is selected from the group consisting of gold, silver, copper, nickel, aluminum, tin, and palladium; a multi-layer metal material in which a plurality of materials selected from the metals are layered; and an alloy of a plurality of materials selected from the metals.

5. A hollow type semiconductor device, comprising:
a semiconductor element;
an element mounting portion supporting the semiconductor element;
an inner lead provided around the element mounting portion, and electrically connected to the semiconductor element;
a frame-shaped wiring provided around the element mounting portion and the inner lead;
an outer lead provided in contact with a back surface of the inner lead;
a first frame-shaped wall provided in contact with a back surface of the frame-shaped wiring;
a resin sealing body provided between the inner lead and the frame-shaped wiring, and between the outer lead and the first frame-shaped wall;
a second frame-shaped wall provided in contact with a surface of the frame-shaped wiring opposite from the back surface of the frame-shaped wiring; and
a sealing plate provided in contact with a surface of the second frame-shaped wall opposite from a surface on which the second frame-shaped wall is in contact with the frame-shaped wiring,
the element mounting portion, the inner lead, and the frame-shaped wiring being exposed on a first surface of the resin sealing body, and the outer lead and the first frame-shaped wall being exposed on a second surface which is a surface opposite from the first surface.

6. The hollow type semiconductor device according to claim 5, wherein the sealing plate has an outer edge portion, and inner side surfaces of the outer edge portion are in contact with outer side surfaces of the second frame-shaped wall.

7. The hollow type semiconductor device according to claim 5, further comprising a second resin sealing body provided to cover outer surfaces of the sealing plate and outer surfaces of the second frame-shaped wall.

8. The hollow type semiconductor device according to claim 6, further comprising a second resin sealing body provided to cover outer surfaces of the sealing plate and outer surfaces of the second frame-shaped wall.

9. The hollow type semiconductor device according to claim 5, wherein the second frame-shaped wall is formed from one of a single-layer material having a layer of one of metals that is selected from the group consisting of gold, silver, copper, nickel, aluminum, tin, and palladium; a multi-layer metal material in which a plurality of materials selected from the metals are layered; and an alloy of a plurality of materials selected from the metals.

10. The hollow type semiconductor device according to claim 6, wherein the second frame-shaped wall is formed from one of a single-layer material having a layer of one of metals that is selected from the group consisting of gold, silver, copper, nickel, aluminum, tin, and palladium; a multi-layer metal material in which a plurality of materials selected from the metals are layered; and an alloy of a plurality of materials selected from the metals.

11. The hollow type semiconductor device according to claim 7, wherein the second frame-shaped wall is formed from one of a single-layer material having a layer of one of metals that is selected from the group consisting of gold, silver, copper, nickel, aluminum, tin, and palladium; a multi-layer metal material in which a plurality of materials selected from the metals are layered; and an alloy of a plurality of materials selected from the metals.

12. The hollow type semiconductor device according to claim 8, wherein the second frame-shaped wall is formed from one of a single-layer material having a layer of one of metals that is selected from the group consisting of gold, silver, copper, nickel, aluminum, tin, and palladium; a multi-layer metal material in which a plurality of materials selected from the metals are layered; and an alloy of a plurality of materials selected from the metals.

13. The hollow type semiconductor device according to claim 5, wherein the sealing plate is formed from one of a single material that is one of an inorganic material including a metal material and glass and an organic material including resin; and a multi-layer material in which a plurality of materials selected from the materials of the single material are layered.

14. The hollow type semiconductor device according to claim 6, wherein the sealing plate is formed from one of a single material that is one of an inorganic material including a metal material and glass and an organic material including resin; and a multi-layer material in which a plurality of materials selected from the materials of the single material are layered.

15. The hollow type semiconductor device according to claim 7, wherein the sealing plate is formed from one of a single material that is one of an inorganic material including a metal material and glass and an organic material including resin; and a multi-layer material in which a plurality of materials selected from the materials of the single material are layered.

16. The hollow type semiconductor device according to claim 8, wherein the sealing plate is formed from one of a single material that is one of an inorganic material including a metal material and glass and an organic material including resin; and a multi-layer material in which a plurality of materials selected from the materials of the single material are layered.

* * * * *